United States Patent [19]
Takahashi et al.

[11] Patent Number: 5,892,236
[45] Date of Patent: Apr. 6, 1999

[54] PART FOR ION IMPLANTATION DEVICE

[75] Inventors: Yoshitomo Takahashi, Fujisawa; Hiroaki Wada, Kawasaki; Taro Miyamoto, Yokohama, all of Japan

[73] Assignee: Bridgestone Corporation, Tokyo, Japan

[21] Appl. No.: 903,423

[22] Filed: Jul. 30, 1997

[30] Foreign Application Priority Data

Jul. 9, 1997 [JP] Japan ..................... 9-183446

[51] Int. Cl.$^6$ ..................... H01J 37/30
[52] U.S. Cl. ..................... 250/492.21
[58] Field of Search ............... 250/492.21, 398

[56] References Cited

U.S. PATENT DOCUMENTS 4,209,474  6/1980  Prochazka ..................... 264/29.5
4,569,922  2/1986  Suzuki ..................... 501/89

*Primary Examiner*—Bruce Anderson
*Attorney, Agent, or Firm*—Oliff & Berridge, PLC

[57] ABSTRACT

A part for an ion implantation device employing a silicon carbide sintered body is provided. The density of the silicon carbide sintered body is 2.9 g/cm$^3$ or more. The silicon carbide sintered body is obtained by sintering a mixture in which silicon carbide powder and a non-metal-based sintering additive are mixed uniformly. The non-metal-based sintering additive is formed of an organic compound which generates carbon upon heating or the like. As a result, a part for an ion implantation device with excellent heat resistance and ion resistance and which causes little contamination is provided.

18 Claims, 1 Drawing Sheet

PART FOR ION IMPLANTATION DEVICE

BACKGROUND OF THE INVENTION

1. Field of the Invention

The present invention relates to a part for an ion implantation device which is used in the ion implantation device in which an impurity element (a doping element) is incorporated into a wafer.

2. Description of the Related Art

The manufacturing of a semiconductor device includes an implantation process in which a doping element is injected in a silicon wafer. There are mainly two methods used in the implantation process: a method of diffusing vapor phase heat in a diffusion furnace at high temperature; and an ion implantation method in which a doping element is accelerated and implantated in the wafer surface. Since the amount of dope and the like can be accurately controlled, the ion implantation method has become mainstream in recent years.

As shown in FIG. 1, an ion implantation device 10 used in ion implantation methods includes an ion generating portion 12 which generates ions from gases such as $BF_3$, $PH_3$, $AsH_3$, or the like; a gas supplying portion (not shown) which supplies gas to the ion generating portion 12; a withdrawing electrode 14 which withdraws the generated ions from the ion generating portion 12 and forms an ion beam; a mass analyzing portion 16 whose planar configuration is substantially L-shaped, and which applies a predetermined magnetic field to the ion beam and extracts only the desired type of ion as the rate of curvature of the orbit, which curvature is caused by the applied magnetic field, depends on the type of ion contained in the ion beam; a beam line portion 20 which is continuous with the mass analyzing portion 16 and is disposed so as to be substantially perpendicular to the orbit of the ion beam formed by the withdrawing electrode 14; an aperture 22 which is disposed on the opposite side of the beam line portion 20 with respect to the mass analyzing portion 16 and sets the radius of the ion beam to a predetermined radius; an acceleration portion 24 which is continuous with the beam line portion 20 and accelerates the energy of the ions to predetermined levels; and an implanting portion 28 which injects the accelerated ions into a substrate 26.

Various parts are included in the ion implantation device 10. The parts must satisfy the following characteristics: (1) heat resistance and durability against ions or plasma are good, (2) no harm is done to the semiconductor device serving as a product (low contamination), and (3) even if ions collide with the ion implantation device, atoms or molecules harmful to semiconductor devices are not ejected above permissible levels (low sputtering). In order to satisfy these characteristics, carbon materials such as graphite or vitric carbon are used for the parts.

Recently, carbon materials with considerably high purity have become available, but the ion resistance of the carbon material is not very high.

As a result, ceramic materials with heat resistance comparable to that of carbon materials and having high level hardness and excellent ion resistance are desirable. Above all, silicon carbide is the most desirable since the elements thereof are harmless to semiconductor devices serving as products.

However, because it is difficult to sinter silicon carbide, a small amount of boron carbide, alumina, or the like is generally added to the silicon carbide as an additive for facilitating the sintering. Since these additives become impurities, a conventional silicon carbide is inappropriate as a material of the aforementioned parts for an ion implantation device.

Accordingly, a silicon carbide sintering method and a sintered body which does not use the aforementioned harmful additive are desired. For example, i) a method of manufacturing a sintered body with fine powder formed through vapor phase epitaxy employing gas or a solution including silicon and carbon as a material and by using the formed powder as a material; and ii) a method of manufacturing directly a plate-shaped molded body (sintered body) through vapor phase epitaxy employing gas or a solution including silicon and carbon as a material are proposed.

However, in these methods, there are drawbacks in that the productivity is very poor and the cost is high. Further, the above-described Method i) has a drawback in that the powder is too fine and particles are easily generated even after the powder is sintered. Method ii) has a drawback in that it is difficult to manufacture a thick molded body.

SUMMARY OF THE INVENTION

Figure 1:
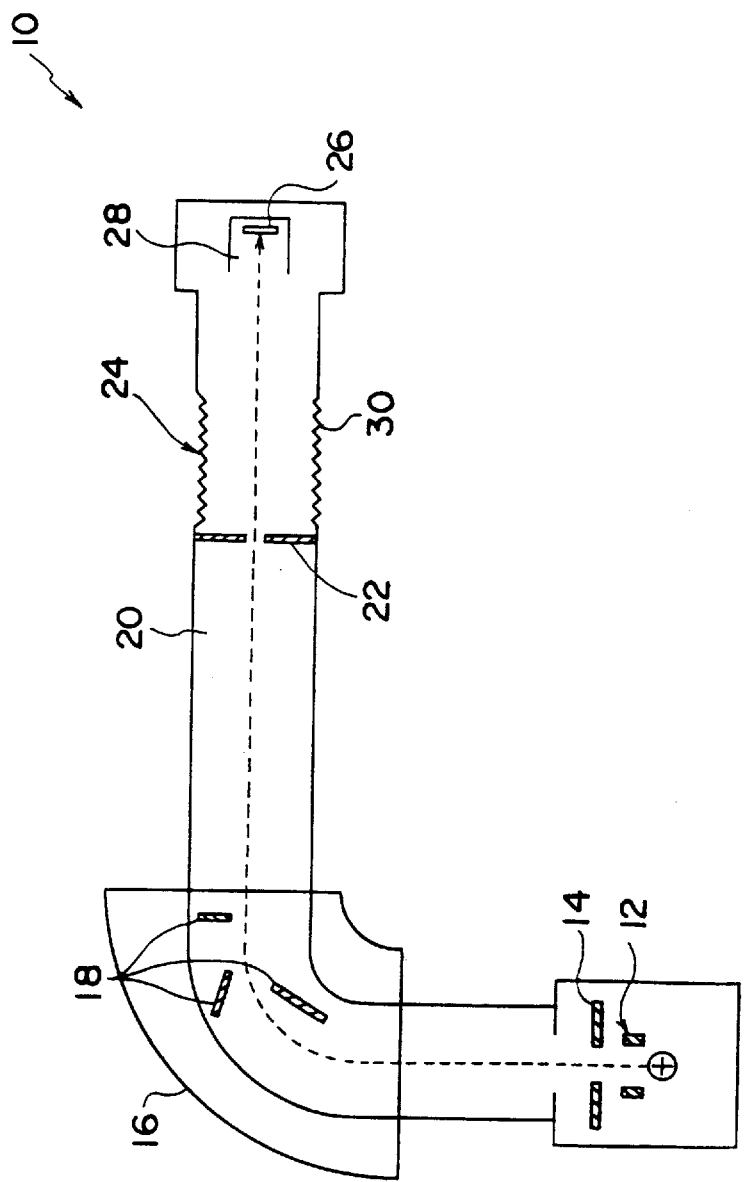
FIG. 1 is a schematic structural view of an ion implantation device.

The present invention was developed in view of the aforementioned, and the object thereof is to provide a part for an ion implantation device which has good heat resistance and ion resistance and which results in little contamination.

As a result of assiduous studies, the inventors have found that, when a sintered body made of silicon carbide obtained through specific manufacturing method is used as a part for an ion implantation device, extremely good characteristics are obtainable. The present invention has been thereby completed.

Namely, a part for an ion implantation device which is formed by a silicon carbide sintered body, the density of said silicon carbide sintered body being at least 2.9 $g/cm^3$, and said silicon carbide sintered body being obtained by sintering a mixture in which silicon carbide powder and a non-metal-based sintering additive are mixed uniformly.

In accordance with the present invention, when the silicon carbide powder is sintered, instead of a metal-based sintering additive such as a metal (for example, boron, aluminum, and beryllium), and a compound thereof, or a carbon-based sintering additive such as carbon black and graphite, only non-metal-based sintering additive is used as a sintering additive. Accordingly, a part for an ion implantation device is provided in which the purity of the sintered body is high, the number of foreign objects in the crystal boundary is small, thermal conductivity is good and, as a result, heat resistance is good, and the fundamental properties of silicon carbide, i.e., low contamination and good wear resistance, are better compared to those of carbon materials.

DESCRIPTION OF THE PREFERRED EMBODIMENTS

The present invention will be described in detail hereinafter.

Silicon carbide powder used as a raw material of the part for an ion implantation device of the present invention manufactured from silicon carbide may be α-type, β-type, amorphous silicon carbide powders or mixtures thereof. In particular, β-type silicon carbide powder is preferably used. The grade of the β-type silicon carbide powder is not particularly specified, and for example, β-type silicon carbide powder which is commercially available can be used. From the viewpoint of densification, it is preferable that the particle diameter of the silicon carbide powder be small and from about 0.01 to about 5 μm, and more preferably from about 0.05 to about 3 μm. If the particle diameter is less than 0.01 μm, it is not preferable since it is difficult to handle the silicon carbide powder during the measuring and mixing processes and the like. If the particle diameter exceeds 5 μm, it is not preferable since the specific surface area of the silicon carbide powder is small, i.e., the surface area thereof which makes contact with adjacent granules becomes small, and it is difficult to achieve densification.

As a preferable aspect of silicon carbide raw material powder, a silicon carbide powder in which the particle diameter is 0.05 to 1μm, the specific surface area is 5 m$^2$/g or more, the free carbon is 1% or less, and the oxygen content is 1% or less is preferably used. Further, the particle size distribution of the silicon carbide powder to be used is not particularly limited, and from the viewpoints of improving the filling density of the powder and the reactivity of silicon carbide at the time of manufacturing the silicon carbide sintered body, silicon carbide powder having two or more size distribution peaks may be used.

The purity of the silicon carbide sintered body used for the part for an ion implantation device is preferably high. In order to obtain a silicon carbide sintered body of high purity, the highly pure silicon carbide powder may be used as the raw material silicon carbide powder.

The highly pure silicon carbide powder can be obtained, for example, in accordance with a manufacturing method including a sintering process in which a solid material obtained by uniformly mixing at least one type or more of a liquid silicon compound, at least one type or more of a liquid organic compound which generates carbon upon heating, and a polymerizing or cross-linking catalyst, is carbonized through heating in a non-oxidizing atmosphere, and thereafter, sintered in a non-oxidizing atmosphere.

As a silicon compound (hereinafter occasionally referred to as "silicon source") which is used in manufacturing the highly pure silicon carbide powder, the liquid and solid compounds can be combined. However, at least one type of compound must be selected from the liquid compounds. As the liquid compound, alkoxysilane (mono-, di-, tri-, tetra-) and polymers of tetraalkoxysilane is used. Among alkoxysilanes, tetraalkoxysilane is preferably used, and more concretely, methoxysilane, ethoxysilane, propoxysilane, butoxysilane, or the like can be used. Regarding handling, ethoxysilane is preferable. Moreover, as the polymer of tetraalkoxysilane, low molecular weight polymer (oligomer) which has a polymerization degree of about 2 to 15 and a liquid silicic acid polymer whose polymerization degree is even higher can be used. As a solid compound which can be combined, silicon oxide can be used. In the present invention, silicon oxide includes SiO, silica sol (colloidal hyperfine silica containing liquid, including an OH group or an alkoxyl group), silicon dioxide (silica gel, hyperfine silica, quartz powder), or the like.

Among the silicon sources, from the viewpoint of good uniformity and good handling ability, the oligomer of tetraetoxysilane or the mixture of oligomer of tetraetoxysilane and fine powder silica is preferable. Further, the highly pure materials are used for these silicon sources, and the initial content of impurity is preferably 20 ppm or less, and more preferably 5 ppm or less.

Further, as an organic compound which is used for manufacturing the silicon carbide powder and which generates carbon upon heating, a liquid compound or a combination of liquid and solid compounds can be used. It is preferable that an organic compound whose remaining carbon ratio is high and which is polymerized or cross-linked by a catalyst or upon heating is, for example, a monomer or prepolymer of a resin such as phenol resin, furan resin, polyimide, polyurethane, polyvinyl alcohol, or the like. Other liquid compounds such as cellulose, sucrose, pitch, tar, or the like may be used, and especially, resol-type phenol resin is preferable. Further, the purity of the compound can be controlled and selected appropriately in accordance with purpose. In particular, in the case in which highly pure silicon carbide powder is needed, it is preferable to use an organic compound which does not contain 5 ppm or more of each metal.

When the silicon carbide powder which is a raw material powder and is used in the present invention is manufactured, the ratio of carbon to silicon (hereinafter, "C/Si ratio") is defined by effecting elemental analysis of a carbide intermediate product obtained by carbonizing a mixture. Stoichiometrically, when C/Si ratio is 3.0, free carbon within the generated silicon carbide is 0%. However, in reality, due to the vaporization of SiO gas which is generated simultaneously, free carbon generates in a low C/Si ratio. It is important to determine the blending ratio in advance such that the amount of the free carbon in the silicon carbide powder produced is a suitable amount for the production of the sintered body. Normally, in the sintering in the vicinity of 1 atmospheric pressure and at 1600° C. or more, when the C/Si ratio is 2.0 to 2.5, the free carbon can be prevented and the range can be used preferably. When C/Si ratio is 2.5 or more, the free carbon increases remarkably. However, because the free carbon has an effect of preventing particle growth, the range may be selected appropriately for the purpose of forming particles. In the case where sintering is performed when the atmospheric pressure is low or high, because the C/Si ratio for obtaining pure silicon carbide varies, the C/Si ratio is not necessarily limited to the above range.

Because an effect on sintering which effect free carbon has is very weak compared to that of the carbon generated by non-metal-based sintering additive coated on the surface of the silicon carbide powder used in the present invention, it can be basically ignored.

Moreover, in the present invention, in order to obtain a solid material in which a silicon source and an organic compound, which generates carbon upon heating, are mixed uniformly, the mixture of the silicon source and the organic compound may be hardened, as occasion demands, so as to form a solid material. As the hardening method, a cross-linking method upon heating, a hardening method through a hardening catalyst, a method using electron beams or radiation can be used. The hardening catalyst can be selected appropriately in accordance with a carbon source. In the case in which the carbon source is phenol resin or furan resin, acid groups such as toluenesulfonic acid, toluenecarboxylic acid, acetic acid, oxalic acid, hydrocholoric acid, sulfuric acid, or the like or amine groups such as hexamine or the like is used as the hardening catalyst.

The heating and carbonization of the raw material mixed solid material is performed by heating the solid material at 800° C. to 1000° C. for 30 to 120 minutes in a non-oxidizing atmosphere of nitrogen, argon or the like.

Further, silicon carbide is generated by heating the carbide at a temperature of from 1350° C. to 2000° C. in a non-oxidizing atmosphere of argon or the like. The temperature and time for sintering can be selected appropriately in accordance with the desired characteristics such as particle diameter and the like. However, for more effective production, sintering at 1600° C. to 1900° C. is preferable.

Furthermore, when powder with even higher purity is required, the heating process is effected for 5 to 20 minutes at 2000° to 2100° C. at the time of the aforementioned sintering. In this way, impurities can be further removed.

From the above description, as a method of obtaining silicon carbide powder whose purity is particularly high, a method of manufacturing a raw material powder described in a method of manufacturing single crystals, which was applied as Japanese Patent Application No. 7-241856, can be used. Namely, a method of manufacturing the highly pure silicon carbide powder includes a process for generating silicon carbide and a process for post-treatment. In the process for generating silicon carbide, one or more compounds selected from the group consisting of highly pure tetraalkoxysilane, tetraalkoxysilane polymer, and oxidized silicon forms a silicon source, highly pure organic compound which generates carbon upon heating forms a carbon source, the sources are mixed uniformly and the obtained mixture is heated/sintered in a non-oxidizing atmosphere so as to obtain silicon carbide powder. In the process for post-treatment, the obtained silicon carbide powder is held at a temperature of 1700° C. or more to less than 2000° C., and while the powder is held at this temperature, at least one heating process is effected at 2000° C. or more to less than 2100° C. for 5 to 20 minutes. By effecting the above two processes, the silicon carbide powder containing impurities at 0.5 ppm or less is obtained.

Further, when a silicon carbide sintered body which is used suitably for a part for an ion implantation device of the present invention is manufactured, as a non-metal-based sintering additive which is mixed with the above silicon carbide powder, a material which is a so-called carbon source and generates carbon upon heating is used. Examples thereof include organic compounds which generate carbon upon heating or silicon carbide powder (the particle diameter is about 0.01 to 1 μm) which is coated with the organic compounds. From the viewpoint of effects, the former is more preferable.

Further, in the present invention, a material which is used as an organic compound (hereinafter, "carbon source") which is mixed with the above-described silicon carbide powder and generates carbon upon heating has a function of promoting reaction by adding as non-metal-based sintering additive, instead of conventional sintering additive. Specific examples of the organic compounds that generate carbon upon heating include coal tar pitch, phenol resins, furan resins, epoxy resins, phenoxy resins, and various saccharides including monosaccharides such as glucose, oligosaccharides such as sucrose, and polysaccharides such as cellulose and starch, having a high residual carbon ration. For the purpose of uniform mixing with the silicon carbide powder, it is preferable to use organic compounds which are liquids at room temperature, organic compounds which can dissolve in solvents, or organic compounds which are softened or melted upon heating such as thermoplastic or thermally melting materials. Above all, phenol resins with which a molded product of a high strength can be obtained, particularly resol-type phenol resins, are desirable.

When these organic compounds are heated, it is assumed that inorganic carbon-based compounds such as carbon black or graphite are generated in the system and function effectively as sintering additives. Even if carbon black or graphite powder, which are conventionally known as carbon sintering additives, are added, the effects of the present invention which are obtained by adding the above non-metal-based sintering additives cannot be achieved.

In the present invention, when the mixture of silicon carbide powder and non-metal-based sintering additives is obtained, it is preferable that the non-metal-based sintering additives are dissolved or dispersed in a solvent and that the obtained solution or dispersion is mixed with the silicon carbide powder. The solvent which is suitable for a compound to be used as non-metal-based sintering additive is preferable. Concretely, for phenol resin which is an organic compound which generates carbon upon suitable heating, lower alcohols such as ethyl alcohol or the like, ethyl ether, acetone or the like can be selected. Further, regarding these non-metal-based sintering additives and the solvent as well, it is preferable to use those having a low impurity content.

In the present invention, the surface of the silicon carbide powder may be coated with these non-metal-based sintering additives.

When the amount of the non-metal-based sintering additive mixed with the silicon carbide powder is too small, the density of the sintered body does not increase. When the amount of addition thereof is too large, free carbons increase and hinder densification. The amount depends on the type of non-metal-based sintering additives used, but in general, the amount added is adjusted to 10% by weight or less, and preferably 2 to 5% by weight. The amount of addition can be determined by determining the amount of silica (silicon oxide) on the surface of the silicon carbide powder with a hydrofluoric acid and by calculating stoichiometrically the added amount of non-metal-based sintering additive which amount is sufficient for the reduction of silica.

The amount of addition in the form of carbon is determined in consideration of the residual carbon ratio of the non-metal-based sintering additives after thermal decomposition of the auxiliaries (the proportion of carbon generated within the non-metal-based sintering additives), based on the premise that the silica quantified by the above method is reduced by the carbon generated from the non-metal-based sintering additives according to the following reaction formula.

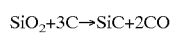

$$SiO_2 + 3C \rightarrow SiC + 2CO$$

Further, in the silicon carbide sintered body relating to the present invention, it is preferable that the sum of carbon atoms derived from silicon carbide included in the silicon carbide sintered body and carbon atoms derived from non-metal-based sintering additives exceeds 30% by weight and is 40% by weight or less. If the content is 30% by weight or less, the proportion of impurities in the sintered body increases. If the content exceeds 40% by weight, the carbon content increases, the density of the obtained sintered body drops, and characteristics of the sintered body such as strength and oxidation resistance deteriorate, which is not preferable.

When the silicon carbide sintered body relating to the present invention is manufactured, at first, silicon carbide powder and non-metal-based sintering additives are mixed uniformly. As mentioned before, phenol resin which is a non-metal-based sintering additive is dissolved in a solvent such as ethyl alcohol and then the obtained solution is well mixed with the silicon carbide powder. The mixing can be carried out by known mixing means, e.g., a mixer, a planetary ball mill, or the like. The mixing is preferably carried out over 10 to 30 hours, and more particularly over 16 to 24 hours. After sufficient mixing, the solvent is removed at a temperature suited to its physical properties, e.g., 50° to 60° C. in the case of the previously-mentioned ethyl alcohol. The mixture is dried by evaporation. The raw material powder derived from the mixture is obtained by sieving. From the viewpoint of purification, it is necessary that a ball mill container and a ball are made of a synthetic resin containing as little metal as possible. Moreover, a granulating device such as a spray drier or the like may be used for drying.

The sintering process which is required in the method of manufacturing a part for the ion implantation device of the present invention is a process in which the mixture of powder or the molded body of the mixture of powder obtained by a molding process, to be described later, is placed and hot-pressed within a mold at a temperature of 2000° to 2400° C., at a pressure of 300 to 700 kgf/cm$^2$, and in a non-oxidizing atmosphere.

From the viewpoint of the purity of the obtained sintered body, in order that the molded body does not directly contact the metal portion of the mold, it is preferable that a graphite material is used on some or all of the mold, which is used herein, or that a Teflon sheet or the like is interposed.

In the present invention, the pressure of hot pressing can be 300 to 700 kgf/cm$^2$. In the case in which pressure is 400 kgf/cm$^2$ or more, there is the need to select parts for hot pressing, e.g., dies, punches, or the like, to be used herein, with high pressure resistance.

Here, the sintering process will be described in detail. Before the hot-pressing process for manufacturing a sintered body, it is preferable that heating and temperature-raising are carried out under the following conditions so as to sufficiently remove impurities, and to realize full carbonization of the carbon source. Then, it is preferable that hot-pressing under the above conditions is performed.

Namely, the following two-stage temperature-raising process is preferably effected. Firstly, the interior of a furnace is heated slowly from room temperature to 700° C. in a vacuum. If it is difficult to control the temperature within the high temperature furnace, the temperature can be raised continuously to 700° C. Preferably, the interior of the furnace is set to 10$^{-4}$ torr, and the temperature is raised slowly from room temperature to 200° C. and held thereat for a fixed time. Thereafter, the temperature is continuously raised slowly to 700° C. and kept there for a fixed time. In the first temperature-raising process, absorbed water or bonding agents are broken up/decomposed, and the carbon source is carbonized by thermal decomposition. A suitable period of time over which the temperature is held at around 200° C. or at around 700° C. is selected in accordance with the type of bonding agent and the size of the sintered body. The point in time when the lowering in the degree of the vacuum becomes small to some extent, is taken as an indication of whether the holding time is sufficient or not. If rapid heating is effected at this stage, it is not preferable since the removal of impurities or carbonization of the carbon source cannot be effected sufficiently and cracking or holes may appear in the molded body.

For example, regarding a sample of about 5 to 10 g, the interior of the furnace is set to 10$^{-4}$ torr, the temperature is raised slowly from room temperature to 200° C. and is held thereat for about 30 minutes. Thereafter, the temperature is continuously raised slowly to 700° C. The time period over which the temperature is raised from room temperature to 700° C. is about 6 to 10 hours, and preferably around 8 hours. Further, it is preferable that the temperature is held at around 700° C. for about 2 to 5 hours.

In a vacuum, the temperature is raised from 700° C. to 1500° C. over about 6 to 9 hours under the above conditions and is held at 1500° C. over about 1 to 5 hours. In this process, it is thought that silicon dioxide and silicon oxide are reduced. In order to remove oxygen attached to the silicon, it is important to fully complete reduction. It is necessary that the temperature is held at 1500° C. until the generation of carbon monoxide, which is a by-product of the reduction, is completed, i.e., the decrease in the degree of vacuum becomes small and the degree of vacuum is recovered to a degree in the vicinity of 1300° C.; the temperature before reduction. By the reducing reaction in the second temperature-raising process, silicon dioxide, which adheres to the surface of the silicon carbide powder, prevents densification and causes the growth of oversized particles, is removed. Gas which includes SiO and CO generated during the reducing reaction includes impurity elements. However, the gas generated is constantly discharged into a reaction furnace and removed with a vacuum pump. Accordingly, from the viewpoint of purification, it is preferable that the temperature is held sufficiently.

After the temperature-raising process is finished, high-pressure hot pressing is preferably carried out. When the temperature is raised above 1500° C., sintering starts. At that time, in order to prevent abnormal particle growth, pressure is applied at 300 to 700 kgf/cm$^2$. Thereafter, in order to make the interior of the furnace a non-oxidizing atmosphere, inert gas is introduced thereto. As the inert gas, nitrogen or argon is used. Since argon is not reactive at high temperatures, argon gas is preferably used.

After the interior of the furnace is made non-oxidizing, heating and pressure-application is effected so that the temperature is 2000° to 2400° C. and the pressure is 300 to 700 kgf/cm$^2$. The pressure at the time of pressing can be selected according to the particle diameter of the raw material powder. When the particle diameter of the raw material powder is small, even if the pressure at the time of application is relatively small, a suitable sintered body is obtained. Further, the temperature is raised from 1500° C. to 2000°–2400° C., which is the maximum temperature, over 2 to 4 hours. Sintering advances rapidly at 1850° to 1900° C. Further, this maximum temperature is held for 1 to 3 hours and then sintering is completed.

When the maximum temperature is less than 2000° C., it is not preferable since densification is unsatisfactory. When the temperature exceeds 2400° C., it is not preferable because there is a risk that the molded body raw material gets sublimated (decomposed). Further, when the pressure applied is less than 500 kgf/cm$^2$, it is not preferable since densification is unsatisfactory. When the condition exceeds 700 kgf/cm$^2$, molds such as graphite molds may be broken, and thus, it is not preferable as regards the manufacturing efficiency.

In the sintering process, from the viewpoint of maintaining the purity of the obtained sintered body, the graphite mold, the thermal insulating material of the heating furnace, or the like used herein is preferably a highly pure graphite raw material. The graphite raw material which was subjected to high purity processing is used. Concretely, graphite raw material baked sufficiently beforehand at a temperature of 2500° C. or more which material does not generate impurities at the sintering temperature is desirable. Further, it is preferable that the inert gas used is a high purity product with few impurities.

In the present invention, through the above-described sintering process, the silicon carbide sintered body having excellent characteristics can be obtained. From the viewpoint of densification of the finally-obtained sintered body, a molding process, which will be described later, may be effected in advance of the sintering process. The molding process which can be performed in advance of the sintering process is described herein. The molding process is the step in which raw material powder obtained by mixing uniformly silicon carbide powder and a carbon source, is placed in a mold, and then heated and pressurized within the temperature range of 80° to 300° C. for 5 to 60 minutes and in which the molded body is adjusted beforehand. From the viewpoint of densification of the final sintered body, it is preferable that the mold is filled with the raw material powder extremely densely. This molding step allows to make bulky powder compact previously in filling the sample for the hot pressing. Accordingly, this facilitates production of a highly dense sintered body and a thick sintered body by repeating this molding step.

While the heating temperature is within the range of 80° to 300° C., and preferably 120° to 140° C. and the pressure is within the range of 60 to 100 kgf/cm$^2$, the filled raw material powder is pressed so that the density thereof is 1.5 g/cm$^3$ or more, and preferably 1.9 g/cm$^3$ or more and held in a pressurized state for 5 to 60 minutes, preferably 20 to 40 minutes. The molded body formed by the raw material powder is thereby obtained. As the average particle diameter of the powder is decreased, it is more difficult to increase the density of the molded body. For densification, it is preferable to use vibration packing for placing the powder in the mold. More specifically, the density is preferably 1.8 g/cm$^3$ or higher for the powder having the average particle diameter of about 1 μm, and 1.5 g/cm$^3$ or higher for the powder having the average particle diameter of about 0.5 μm. If the density of the particle diameter is less than 1.5 g/cm$^3$ or less than 1.8 g/cm$^3$, respectively, densification becomes a problem in the density of the finally-obtained sintered body.

Before the sintering process to follow, it is possible for the molded body to be cut beforehand to fit into the hot press mold used. The molded body is disposed in a mold at 2000° to 2400° C., and at a pressure of 300 to 700 kgf/cm$^2$, in a non-oxidizing atmosphere. The molded body is then subjected to a process for hot pressing, i.e., a sintering process. A silicon carbide sintered body having high density and purity is thereby obtained.

A silicon carbide sintered body generated as described above is sufficiently densified and the density thereof is 2.9 g/cm$^3$ or more. If the density of the obtained sintered body is less than 2.9 g/cm$^3$, it is not preferable because mechanical characteristics such as fracture strength, fracture strength or the like, and electrical physical qualities are lowered, and additionally, particle numbers are increased and contaminating effect worsens. More preferably, the density of the silicon carbide sintered body is 3.0 g/cm$^3$ or more.

Further, if the obtained sintered body is a porous body, there are physical drawbacks in that heat resistance, oxidization resistance, chemical resistance and mechanical strength are poor, cleaning is difficult, minute cracking occurs and minute pieces become contaminants, and gas permeation occurs. Thus, the problem of application limitation becomes significant.

The total content of impure elements in the silicon carbide sintered body obtained in the present invention is 5 ppm or less, preferably 3 ppm or less, and more preferably 1 ppm or less. As far as application in the industrial field of semiconductors is concerned, the impurity content as defined through chemical analysis is merely a reference value. In practice, evaluation depends on whether the impurity is dispersed uniformly or locally. Therefore, those skilled in the art use a practical device in general and evaluate by various means the extent to which the impurity contaminates a wafer under predetermined heating conditions. In accordance with a method including a sintering process in which a solid material (which is obtained by uniformly mixing a liquid silicon compound, a liquid organic compound which generates carbon upon heating, and polymerizing or cross-linking catalyst) is carbonized through heating in a non-oxidizing atmosphere, and thereafter, sintered in a non-oxidizing atmosphere. The total content of the impurity element of the silicon carbide sintered body can be as low as 1 ppm or less. Here, the impurity elements are elements of groups 1 to 16 of the periodic table described in the IUPAC Inorganic Chemistry Nomenclature Revised Edition (1989), and having an atomic number of 3 or more, except for atomic numbers 6 to 8 and 14.

In addition, preferable physical properties of a silicon carbide sintered body obtained in the present invention are taken into consideration. For example, it is preferable that fracture strength at room temperature is 50 to 65 kgf/mm$^2$, fracture strength at 1500° C. is 55 to 80 kgf/mm$^2$, Young's modulus is $3.5 \times 10^4$ to $4.5 \times 10^4$, Vickers hardness is 2000 kgf/mm$^2$ or more, Poisson's ratio is 0.14 to 0.21, the coefficient of thermal expansion is $3.8 \times 10^{-6}$ to $4.2 \times 10^{-6}$ (°C.$^{-1}$), the thermal conductivity is 150 W/m.K or more, the specific heat is 0.15 to 0.18 cal/g. °C., the thermal shock resistance is 500 to 700 ΔT°C., and the specific resistance is 1 Ω.cm or less.

The sintered body obtained in accordance with the above manufacturing method is subjected to machining, polishing, washing treatments or the like for the purpose of actual application. It is used in various parts included in the ion implantation device.

The parts for the ion implantation device, to which the present invention is applied, are as follows: an inner wall liner which is included in the ion generating portion 12 shown in FIG. 1 and is disposed in the vicinity of a filament (not shown), the withdrawing electrode 14, ion shield plates 18 which are disposed in the mass analyzing portion 16 and blocks ion types other than those desired, and the aperture 22 for adjusting the diameter of the ion beam, and an acceleration tube 30 which forms the outer wall of the acceleration portion 24.

In the above manufacturing method, as long as the above heating conditions are satisfied, the manufacturing device or the like is not particularly limited. If the pressure resistance of the mold for sintering is taken in account, well-known heating furnaces or reaction devices can be used.

The contents of impurity elements is preferably 1 ppm or less in each of a silicon carbide powder which is the raw material powder of the present invention, a silicon source and a carbon source for manufacturing the raw material powder, and an inert gas which is used to produce the non-oxidizing atmosphere. However, as long as the purity is within the permissible range of purification during the heating and sintering processes, the purity is not necessarily limited to this value. Moreover, impurity elements are elements of groups 1 to 16 of the periodic table described in the IUPAC Inorganic Chemistry Nomenclature Revised Edition (1989), and having an atomic number 3 or more, except for atomic numbers 6 to 8 and 14.

EXAMPLES

The present invention will be described hereinafter concretely by giving Examples. As long as the scope of the present invention is not exceeded, the present invention is not limited to these Examples.

EXAMPLE 1

Manufacture of Molded Body 141 g of commercially available β-type silicon carbide powder (Grade B-HP, manufactured by H. C. Starck Co., of average particle diameter 2 μm) and a solution in which 9 g of highly pure liquid resol-type phenol resin having a water content of 20% were dissolved in 200 g of ethanol, were stirred in a planetary ball mill for 18 hours until mixed fully. Thereafter, the mixture was dried off by evaporating the ethanol at 50° to 60° C. The mixture was put through a 500 μm sieve and uniform silicon carbide raw material powder was obtained. 15 g of raw material powder was put into a mold and pressed at 130° C. for 20 minutes. Accordingly, a plate-shaped molded body of about 3 cm×about 4 cm×about 4 mm and having a density of 2.2 g./cm³ was obtained.

Manufacture of Sintered Body

The sintered body was placed in a graphite mold and subjected to hot pressing under the following conditions. As a device for hot pressing, a high frequency induction heating-type 10 t hot press was used.

(Conditions of Sintering Process)

In a vacuum state of $10^{-5}$ to $10^{-4}$ torr, the temperature was raised from room temperature to 700° C. over 6 hours and held thereat for 5 hours (the first temperature-raising process).

In the vacuum state, the temperature was raised from 700° C. to 1200° C. over 3 hours, and was further raised from 1200° C. to 1500° C. over 3 hours and held thereat for an hour (the second temperature-raising process).

Moreover, pressure of 500 kgf/cm² was applied, and the temperature was raised from 1500° C. to 2200° C. over 3 hours in an argon atmosphere and held thereat for an hour (hot-pressing process).

The density of the obtained sintered body was 3.18 g/cm³, the Vickers hardness thereof was 2500 kgf/mm², and the electrical specific resistance thereof was 0.3 Ω.cm. The obtained sintered body was thermally decomposed by acid in a heat processing, and thereafter, was evaluated by ICP-mass analysis and flameless atomic absorption. The results are given in Table 1.

EXAMPLE 2

Manufacture of Highly Pure Silicon Carbide Powder 680 g of a highly pure ethyl silicate oligomer having a silica content of 40% and 305 g of a highly pure liquid resol-type phenol resin having a water content of 20% were mixed. As catalyst, 137 g of a highly pure toluenesulfonic acid 28% aqueous solution was added to the mixture and hardened, so that a uniform resinous solid material was obtained. The solid material was carbonized in a nitrogen atmosphere at 900° C. for an hour. From the result of elemental analysis, the proportion of C to Si of the obtained carbide was 2.4. Next, 400 g of the carbide was placed in a graphite container, the temperature was raised to 1850° C. in an argon atmosphere and held thereat for 10 minutes. Thereafter, the temperature was raised to 2050° C. and held thereat for 5 minutes. Then, the temperature was lowered and powder having an average particle diameter of 1.3 μm was obtained. The level of impurities of each element was 0.5 ppm or less.

Manufacture of Molded Body 141 g of highly pure silicon carbide powder, which was obtained in accordance with the above-described method, and a solution in which 9 g of a highly pure liquid resol-type phenol resin having a water content of 20% were dissolved in 200 g of ethanol, were stirred in a planetary ball mill for 18 hours until mixed fully. Thereafter, the mixture was dried off by evaporating the ethanol at 50° to 60° C. The mixture was put through a 500 μm sieve and uniform silicon carbide raw material powder was obtained. 15 g of raw material powder was put into a mold and pressed at 130° C. for 20 minutes. Accordingly, a plate-shaped molded body of about 3 cm×about 4 cm×about 4 mm and having a density of 2.1 g/cm³ was obtained.

Manufacture of Sintered Body

The sintered body was placed in a graphite mold and subjected to hot pressing under the following conditions. As a device for hot pressing, a high frequency induction heating-type 10 t hot press was used.

(Conditions of Sintering Process)

In a vacuum state of $10^{-5}$ to $10^{-4}$ torr, the temperature was raised from room temperature to 700° C. over 6 hours and held thereat for 5 hours (the first temperature-raising process).

In the vacuum state, the temperature was raised from 700° C. to 1200° C. over 3 hours, and was further raised from 1200° C. to 1500° C. over 3 hours and held thereat for an hour (the second temperature-raising process).

Moreover, pressure of 500 kgf/cm² was applied, and the temperature was raised from 1500° C. to 2200° C. over 3 hours in an argon atmosphere and held thereat for an hour (hot-pressing process).

The density of the obtained sintered body was 3.15 g./cm³, the Vickers hardness thereof was 2600 kgf/mm², and the electrical specific resistance thereof was 0.2 Ω.cm. The impurity concentrations are shown in the following Table 1.

Further, as a result of measuring in detail the physical properties of the obtained sintered body in Example 2, characteristics other than those given above were as follows: the fracture strength at room temperature was 50 kgf/mm²; the fracture strength at 1500° C. was 50 kgf/mm²; the Young's modulus was $4.1 \times 10^4$; the Poisson's ratio was 0.15; the coefficient of thermal expansion is $3.9 \times 10^{-6} °C.^{-1}$; the thermal conductivity was 200 W/m. K or more; the specific heat was 0.16 cal/g.°C.; and the thermal shock resistance was 530 ΔT°C. It was confirmed that all of the aforementioned desirable physical properties were satisfied.

Comparative Example 1

Manufacture of Molded body 141 g of commercially available β-type silicon carbide powder (Grade B-HP, manufactured by H. C. Starck Co., of average particle diameter 2 μm), 1.1 g of boron carbide (B,C) and a solution in which 9 g of a highly pure liquid resol-type phenol resin having a water content of 20% were dissolved in 200 g of ethanol, were stirred in a planetary ball mill for 18 hours until mixed fully. Thereafter, the mixture was dried off by evaporating the ethanol at 50° to 60° C. The mixture was put through a 500 μm sieve and uniform silicon carbide raw material powder was obtained. 15 g of raw material powder was put into a mold and pressed at 130° C. for 20 minutes. Accordingly, a plate-shaped molded body of about 3 cm×about 4 cm×about 4 mm and having a density of 2.2 g/cm³ was obtained.

Manufacture of Sintered Body

The sintered body was placed in a graphite mold and subjected to hot pressing under the following conditions. As a device for hot pressing, a high frequency induction heating-type 10 t hot press was used.

(Conditions of Sintering Process)

In a vacuum state of $10^{-5}$ to $10^{-4}$ torr, the temperature was raised from room temperature to 700° C. over 6 hours and held thereat for 5 hours (the first temperature-raising process).

In the vacuum state, the temperature was raised from 700° C. to 1200° C. over 3 hours, and was further raised from 1200° C. to 1500° C. over 3 hours and held thereat for an hour (the second temperature-raising process).

Moreover, pressure of 150 kgf/cm² was applied, and the temperature was raised from 1500° C. to 2200° C. over 3 hours in an argon atmosphere and held thereat for an hour (hot-pressing process).

The density of the obtained sintered body was 3.18 g/cm³, the Vickers hardness thereof was 2400 kgf/mm², and the electrical specific resistance thereof was $10^8$ Ω.cm. The impurity concentrations are shown in the following Table 1.

Comparative Example 2

A commercially available highly pure graphite part (density 1.65 g/cm³, Vickers hardness 350 kgf/mm², electrical specific resistance $2.4 \times 10^{-3}$ Ω.cm) was used.

The impurity concentrations are shown in the following Table 1.

TABLE 1

Impurity Concentrations of Sintered Bodies (ppm)

|    | Example 1 | Example 2 | Comparative Example 1 | Comparative Example 2 |
|----|-----------|-----------|-----------------------|-----------------------|
| B  | 0.8       | 0.00      | 1000 or more          | 0.05                  |
| Al | 48        | 0.02      | 55                    | 0.03                  |
| Na | 3         | 0.03      | 10                    | 0.12                  |
| K  | 1.2       | 0.00      | 1.0                   | 0.06                  |
| Mg | 5         | 0.05      | 4                     | 0.04                  |
| Ti | 2         | 0.02      | 5                     | 0.06                  |
| Cr | 5         | 0.00      | 7                     | 0.04                  |
| Fe | 33        | 0.03      | 48                    | 0.08                  |
| Ni | 4         | 0.01      | 5                     | 0.04                  |
| Co | 4         | 0.03      | 3                     | 0.01                  |
| W  | 1.2       | 0.00      | 1.0                   | 0.00                  |
| Cu | 0.5       | 0.00      | 0.8                   | 0.02                  |

The parts of the above Examples and Comparative Examples were mounted to a large current-type ion implantation device to function as an inner wall liner for an ion generating portion and ion beams having a current value of about 7 mA were generated. The heat resistance, ion resistance, and the contaminating effect of these parts were evaluated. The methods of evaluating each physical properties are given as follows.

Heat Resistance

Five inner wall liners formed with the same material were mounted to the ion generating portion, and ion beams were generated for a total of 200 hours. Next, the above-described inner wall liners were replaced with new ones and the test was repeated. The evaluation was made by counting how many of the ten inner liners suffered cracking.

Ion Resistance

A test similar to the above test was carried out, and the average weight loss (%) of the inner wall liners during the test [1−(the weight of inner wall liners after the test)/(the weight of inner wall liners before the test)×100] was determined.

Contaminating Effect

By using the above parts, a commercially available silicon wafer, and a large current-type ion implantation device, ion beams with a current value of about 7 mA were generated and an ion implantation process was carried out. Thereafter, the number of iron atoms within 1 μm of the wafer surface was measured.

The evaluation results are given in Table 2.

TABLE 2

|                              | Example 1 | Example 2 | Comparative Example 1 | Comparative Example 2 |
|------------------------------|-----------|-----------|-----------------------|-----------------------|
| Heat Resistance              | 0/10      | 0/10      | 2/10                  | 1/10                  |
| Ion Resistance (%)           | 0.5       | 0.8       | 1.5                   | 12.3                  |
| Contaminating Effect (atoms/cm²) | $3.3 \times 10^{14}$ | $1.5 \times 10^{10}$ | $2.5 \times 10^{15}$ | $5.0 \times 10^{10}$ |

As can be seen from the above Examples and Comparative Examples, the silicon carbide sintered bodies of Examples obtained in accordance with the methods of the present invention had adequate density, extremely low impurity content, and excellent heat resistance and ion resistance. Further, in Examples, the contaminating effect of each of the silicon carbide sintered bodies was $1 \times 10^{11}$ atoms/cm² or less, and the contamination of the wafer thereof was low. On the other hand, in Comparative Example 1, the heat resistance, the ion resistance, and the contaminating effect of the silicon carbide sintered body in which the boron additive was used were poor. Further, in Comparative Example 2, the contaminating effect of the part formed with graphite was good, but thee heat resistance and the ion resistance were poor.

What is claimed is:

1. A part for an ion implantation device which is formed by a silicon carbide sintered body, the density of said silicon carbide sintered body being at least 2.9 g/cm³, and said silicon carbide sintered body being obtained by sintering a mixture in which silicon carbide powder and a non-metal-based sintering additive are mixed uniformly.

2. A part for an ion implantation device according to claim 1, wherein said non-metal-based sintering additive is an organic compound which generates carbon upon heating.

3. A part for an ion implantation device according to claim 2, wherein the surface of said silicon carbide powder is coated with said non-metal-based sintering additive.

4. A part for an ion implantation device according to claim 3, wherein said silicon carbide sintered body is obtained by hot-pressing said mixture in a non-oxidizing atmosphere.

5. A part for an ion implantation device according to claim 3, wherein said silicon carbide powder is obtained by a manufacturing method which includes a solidifying process and a sintering process; in the solidifying process, a liquid silicon compound, a liquid organic compound which generates carbon upon heating, and one of a polymerizing and a cross-linking catalyst is mixed and then solidified so as to obtain a solid material; in the sintering process, the obtained solid material is carbonized through heating in a non-oxidizing atmosphere, and thereafter, sintered in a non-oxidizing atmosphere.

6. A part for an ion implantation device according to claim 5, wherein the total content of impurity elements included in said silicon carbide sintered body is 1 ppm or less.

7. A part for an ion implantation device according to claim 3, wherein the total content of impurity elements included in said silicon carbide sintered body is 1 ppm or less.

8. A part for an ion implantation device according to claim 2, wherein said silicon carbide sintered body is obtained by hot-pressing said mixture in a non-oxidizing atmosphere.

9. A part for an ion implantation device according to claim 2, wherein said silicon carbide powder is obtained by a manufacturing method which includes a solidifying process and a sintering process; in the solidifying process, a liquid silicon compound, a liquid organic compound which generates carbon upon heating, and one of a polymerizing and a cross-linking catalyst is mixed and then solidified so as to obtain a solid material; in the sintering process, the obtained solid material is carbonized through heating in a non-oxidizing atmosphere, and thereafter, sintered in a non-oxidizing atmosphere.

10. A part for an ion implantation device according to claim 9, wherein the total content of impurity elements included in said silicon carbide sintered body is 1 ppm or less.

11. A part for an ion implantation device according to claim 2, wherein the total content of impurity elements included in said silicon carbide sintered body is 1 ppm or less.

12. A part for an ion implantation device according to claim 1, wherein the surface of said silicon carbide powder is coated with said non-metal-based sintering additive.

13. A part for an ion implantation device according to claim 12, wherein said silicon carbide sintered body is obtained by hot-pressing said mixture in a non-oxidizing atmosphere.

14. A part for an ion implantation device according to claim 1, wherein said silicon carbide sintered body is obtained by hot-pressing said mixture in a non-oxidizing atmosphere.

15. A part for an ion implantation device according to claim 14, wherein the total content of impurity elements included in said silicon carbide sintered body is 1 ppm or less.

16. A part for an ion implantation device according to claim 1, wherein said silicon carbide powder is obtained by a manufacturing method which includes a solidifying process and a sintering process; in the solidifying process, a liquid silicon compound, a liquid organic compound which generates carbon upon heating, and one of a polymerizing and a cross-linking catalyst is mixed and then solidified so as to obtain a solid material; in the sintering process, the obtained solid material is carbonized through heating in a non-oxidizing atmosphere, and thereafter, sintered in a non-oxidizing atmosphere.

17. A part for an ion implantation device according to claim 16, wherein the total content of impurity elements included in said silicon carbide sintered body is 1 ppm or less.

18. A part for an ion implantation device according to claim 1, wherein the total content of impurity elements included in said silicon carbide sintered body is 1 ppm or less.

* * * * *